(12) United States Patent
Biber et al.

(10) Patent No.: US 8,749,238 B2
(45) Date of Patent: Jun. 10, 2014

(54) MAGNETIC RESONANCE APPARATUS

(75) Inventors: Stephan Biber, Erlangen (DE); Franz Eiermann, Rattelsdorf-Ebing (DE)

(73) Assignee: Siemens Aktiengesellschaft, München (DE)

( * ) Notice: Subject to any disclaimer, the term of this patent is extended or adjusted under 35 U.S.C. 154(b) by 400 days.

(21) Appl. No.: 13/186,032

(22) Filed: Jul. 19, 2011

(65) Prior Publication Data

US 2012/0187949 A1 Jul. 26, 2012

(30) Foreign Application Priority Data

Jul. 20, 2010 (DE) .......................... 10 2010 027 673

(51) Int. Cl.
*G01V 3/00* (2006.01)

(52) U.S. Cl.
USPC .......................................... 324/322; 324/318

(58) Field of Classification Search
USPC ............................. 324/322, 318, 314, 312, 300
See application file for complete search history.

(56) References Cited

U.S. PATENT DOCUMENTS

| | | | |
|---|---|---|---|
| 6,323,648 B1 * | 11/2001 | Belt et al. ........................ | 324/322 |
| 7,187,173 B1 * | 3/2007 | Raftery et al. .................. | 324/318 |
| 7,817,000 B2 * | 10/2010 | Rauh ................................ | 335/78 |
| 8,035,389 B2 * | 10/2011 | Xing et al. ...................... | 324/322 |
| 8,384,388 B2 * | 2/2013 | Biber ............................... | 324/322 |

FOREIGN PATENT DOCUMENTS

| | | |
|---|---|---|
| DE | 199 28 428 A1 | 1/2001 |
| DE | 10 2008 023 467 A1 | 12/2009 |

OTHER PUBLICATIONS

German Office Action dated Jun. 27, 2011 for corresponding German Patent Application No. DE 10 2010 027 673.1 with English translation.
Y. Ma et al., "RF Switching Matrix Enables 128 Channel Architecture and Dynamic Element-to-Receiver Receiver Routing," Proc. Intl. Soc. Mag. Reson. Med. 16: (2008), p. 1131.
R. F. Lee et al., "A 128-channel Helium-3 Phased Array at 3T for Highly Accelerated Parallel Imaging in Hyperpolarized Gas MRI," Proc. Intl. Soc. Mag. Reson. Med. 16: (2008), p. 440.
B. Stoeckel et al., "An MRI System with 128 Seamlessly Integrated Receive Channels for Multi-Nuclear Operation," Proc. Intl. Soc. Mag. Reson. Med. 16: (2008), p. 1119.

* cited by examiner

*Primary Examiner* — Louis Arana
(74) *Attorney, Agent, or Firm* — Lempia Summerfield Katz LLC

(57) ABSTRACT

A magnetic resonance apparatus includes a receiving system with at least one receiver configured to process at least one receive signal of a receive channel. The magnetic resonance apparatus further includes at least one switching device configured to variably assign a first number of receive channels to a first number of inputs of the at least one receiver. The switching device has a crossbar switch and a pre-selection circuit connected upstream of the crossbar switch. Each receive channel of a first group of receive channels is directly connected to an input of a first group of inputs that is permanently assigned to the respective receive channel.

20 Claims, 4 Drawing Sheets

MAGNETIC RESONANCE APPARATUS

This application claims the benefit of DE 10 2010 027 673.1, filed Jul. 20, 2010.

BACKGROUND

The present embodiments relate to a magnetic resonance apparatus having a receiving system with at least one receiver configured to process at least one receive signal of a receive channel, and at least one switching device configured to variably assign a first number of receive channels to a first number of inputs of the at least one receiver.

Local coils are used with magnetic resonance apparatuses to acquire magnetic resonance images having a high signal-to-noise ratio. More particularly, excited nuclei in an object that is to be imaged induce a voltage in the coil conductor of the local coil. A low-noise (pre) amplifier (e.g., LNA) amplifies the induced voltage, and the amplified induced voltage is forwarded, via cable or wireless communication, at the magnetic resonance frequency (transmit frequency), to an input of a receiver of the receiving system. In order to further improve the signal-to-noise ratio, particularly for high-resolution magnetic resonance images, high-field systems, which have basic field strengths of approximately three or more Tesla, may also be used.

When local coils are used, they are generally connected to suitable plug-in locations on a patient couch. The different receive channels of the local coils may then be connected, via said plug-in locations, to corresponding inputs on available receivers. In some cases, however, there may be more receive channels than available inputs on the receivers, such that more individual coil elements (loops) are present than the receiving system may evaluate. A switching device may thus be provided between the coil elements, i.e. the receive antennas, and the receivers in a magnetic resonance apparatus. The switching device routes the currently active receive channels to the available inputs. This enables a number of coil elements in excess of a number of available receivers to be connected, since in the case of whole-body coverage, it is only necessary to read out those coil elements that are located in the field of view or, alternatively, in the homogeneity volume of the magnetic resonance apparatus.

When local coils are used in a magnetic resonance receiving system, the coil elements, i.e. the receive channels, should be distributed over the individual inputs of the receivers. Since, however, more coil elements are typically disposed around the patient than may be simultaneously located in the field of view or homogeneity volume of the magnet, it is customary to provide fewer receiver inputs than receive channels in order to save costs. Then, however, a switching array, which routes the coil elements that may be connected to the patient couch, is necessary. In some embodiments, the switching array flexibly routes the receive channels to the available receiver inputs.

Accordingly, known magnetic resonance systems include switching devices that may switch any arbitrary receive channel to any arbitrary receiver input. Known switching devices include a crossbar switch. However, crossbar switches may be problematic when the magnetic resonance apparatus has a very high number of channels (e.g., 128 or more). If, for example, it were desired to utilize a magnetic resonance apparatus with 192 receive channels freely connectable to 128 receiver inputs, an extremely large and expensive switching device, particularly an extremely large and expensive crossbar switch, would be required. At high frequencies, the capacity load of the lines increases as the number of switching devices used increases. These increases may lead to problems that are technically difficult to solve. Present-day magnetic resonance systems that have 128 receiver inputs are realized by connecting a plurality of crossbar switches of a similar type in parallel. This is, however, a very unfavorable solution, as such an arrangement is costly and requires a large amount of space.

SUMMARY AND DESCRIPTION

The present embodiments may obviate one or more of the drawbacks or limitations in the related art. For example, a cost-effective and space-saving magnetic resonance apparatus that connects a relatively large number of receive channels to a relatively small number of receiver inputs may be provided.

In one embodiment, a magnetic resonance apparatus has a pre-selection circuit connected upstream of a crossbar switch. For a first group of receive channels, the pre-selection circuit is directly connected to an input of a first group of inputs that is permanently assigned to a respective receive channel.

A receiving system in which the number of receive channels is greater than the number of inputs of the receiver or receivers uses this embodiment. The inputs of the receiver or receivers are divided into a first group of inputs and a second group of inputs. In one embodiment, the first and second groups of inputs are not connected or are separate, and a receive channel of a first group of receive channels (likewise the receive channels are divided into a first and a second group of receive channels) is or may be permanently connected to a predetermined input. As a result, connections (e.g., hard wiring arrangements) may be used to permanently assign a predetermined input of a receiver to a predetermined receive channel. In one embodiment, the connections may be fixed. In other embodiments, the connections may be attachable and/or detachable, as will be explained in more detail below.

When the connections are fixed to the first group of inputs, the crossbar switch is configured to have a number of outputs that corresponds to the number of inputs in the second group of inputs.

Advantageously, known crossbar switches are extended using the front-end pre-selection circuit, or "pre-selector," such that more receive channels may be handled, albeit with restricted switching flexibility. The present embodiments may be implemented in a cost-effective manner, and because a more compact crossbar switch may be used, a smaller amount of installation space may be required as well.

As noted above, receive channels may be assigned to specific coil elements (loops) of a local coil via or using plug-in locations on a patient couch of the magnetic resonance apparatus. To ensure that a user derives optimum benefit from the receiving system described herein, the user must know which receive channels of the first group of receive channels, which are hard-wire connected to corresponding receiver inputs, are assigned to which plug-in locations or, more particularly which terminals (pins) at the plug-in locations. Such an arrangement allows the coil elements to be optimally distributed or connected to the plug-in locations. Accordingly, the magnetic resonance apparatus further includes a patient couch having plug-in locations for a local coil. In one embodiment, predetermined pins of at least one plug-in location are assigned to receive channels. In another embodiment, predetermined pins of all of the plug-in locations are assigned to receive channels. In yet another embodiment, all of the pins of at least one plug-in location are assigned to the first group of receive channels. In other embodiments, the pins of the plug-in locations may be assigned differently, as will be described in greater detail below. In one embodiment, the receive signals may be transmitted from a local coil to the switching device via or using an at least partially wireless connection. In another embodiment, the receive signals may be transmitted from the local coil to the switching device via or using a completely wireless connection. Frequencies or bands may then take the place of the pins/plug-in locations.

In one embodiment, the crossbar switch is configured to distribute the receive channels forming a second group of receive channels and not already assigned to a direct connection to an input of a second group of inputs. In this embodiment, all of the first group of receive channels are permanently assigned and hardwired connected to the first group of inputs. Because the number of input channels is divided into first and second groups of inputs, a reduced-size crossbar switch may be provided. The selection of the plug-in location, or, in some embodiments, the pins at a plug-in location, generally determines whether the receive channels are to be flexibly or fixedly distributed to inputs or not. In one embodiment, the final n pins of a plug-in location are, for example, permanently wired to receiver inputs of the first group, where n is a natural or integer number (e.g., four).

In one embodiment, specific receive channels may be freely assigned to specific inputs when, for example, a joint evaluation is to be performed. Advantageously, the pre-selection circuit may include at least one switch by way of which at least one receive channel of the first group of receive channels may, optionally, be connected either to the crossbar switch or to the direct connection to the input of the first group of inputs. Each receive channel of the first group of receive channels is assigned a switch for its optional connection to the corresponding input of the first group of inputs or to the crossbar switch.

Although the crossbar switch thus includes as many receive inputs as receive channels, it is nonetheless possible to individually choose, for each receive channel of the first group, between permanently assigning the receive channels to an input of the first group of inputs and flexibly assigning the receive channels, via or using the crossbar switch, to an input of the second group of inputs results in a higher level of flexibility. When low and medium numbers of receive channels are required, the crossbar switch is fully flexible. In embodiments in which a number of used receive channels exceeds a number of inputs of the second group of inputs, fixed connections to the first group of inputs may still be used. In these embodiments, the flexibility may be reduced, particularly when high numbers of receive channels are required. However, this flexibility reduction is more than compensated by a cost-effective and compactly designed solution for a magnetic resonance apparatus with a high number of channels.

In one embodiment, the specific plug-in locations on the patient couch are fully assigned to the first group of receive channels. As a result, all of the pins for the specific plug-in locations may be switched to the first group of inputs via the hardwired connection.

In another embodiment, the pre-selection circuit is a separate, retrofittable component. Accordingly, the pre-selection circuit may be separately retrofitted from the crossbar switch, when, for example, a magnetic resonance apparatus having a small or medium number of channels is to be upgraded to a high or higher number of channels. In turn, the pre-selection circuit and the additional receivers are retrofitted, which makes the first group of inputs available.

In yet another embodiment, an intermediate-frequency architecture that permits the use of one line for at least two receive channels at different intermediate frequencies may be provided. In this way, individual lines may be used for a plurality of receive signals and, hence, a plurality of receive channels (multiplexing). An approach of this type was described in, for example, DE 10 2008 023 467 A1. In the arrangement described therein, a transmission path connects a local coil to a receiver. A first receive channel of the local coil has a first coil element for receiving a first magnetic resonance signal. A first mixer also connects to the first coil element. The first mixer forms an intermediate-frequency first signal from the supplied first magnetic resonance signal. A second receive channel of the local coil is similarly provided with a second mixer. The resulting intermediate-frequency second signal formed by the second mixer lies at a different intermediate frequency. Using frequency-division multiplexing, the intermediate-frequency first signal of the first receive channel and the intermediate-frequency second signal of the second receive channel are combined using a signal summation device in the local coil, such that one line or, alternatively, one transmission path may be used to transport two receive signals. In one embodiment, the mixers may be controlled by or using local oscillator frequencies. The local oscillator frequencies may also be transported or controlled over the transmission path.

The present embodiments contemplate using multiplexing. If, for example, a transmission path is used for two or more receive channels, fewer connections need to be established, which, in turn, reduces the requirements to be met by the pre-selection circuit and the crossbar switch.

In such an embodiment, the switching device may also include a signal conditioning device connected upstream of the pre-selection circuit in the transmission direction of the receive signals. For each incoming line, which in most cases is a coaxial cable, the signal conditioning device may include: (1) a band-pass filter that is connected upstream of the corresponding input of the pre-selection circuit and allows the intermediate frequencies used to pass through, (2) a high-pass filter that is connected upstream of a coupling-in point for the auxiliary-frequency signals and converts the intermediate frequencies, and (3) a low-pass filter connected upstream of a coupling-in point for control signals of the PIN diodes.

In order to supply the local coils with the signals necessary for an intermediate-frequency architecture, particularly with the auxiliary-frequency signals of local oscillators that control the first and second mixers, a multiplexing filter bank is installed upstream of the pre-selection circuit for each incoming line. The multiplexing filter bank separates the intermediate-frequency signals of the local coils from the auxiliary-frequency signals (local oscillator signals) and the detuning signals for the PIN diodes.

A pre-selection circuit for use in the receiving system of the magnetic resonance apparatus may also be provided. The pre-selection circuit, which may be used to upgrade or increase the number of channels for an existing receiving system consequently includes permanently prefabricated connections in order to connect a first group of receive channels directly to a first group of inputs of one or more receivers, as desired. Furthermore, the pre-selection circuit may already include a suitable switch so that a receive channel of the first group of receive channels may, optionally, be connected either to a crossbar switch or to the direct connection to an input of the first group of inputs.

DETAILED DESCRIPTION OF THE DRAWINGS

Figure 1:
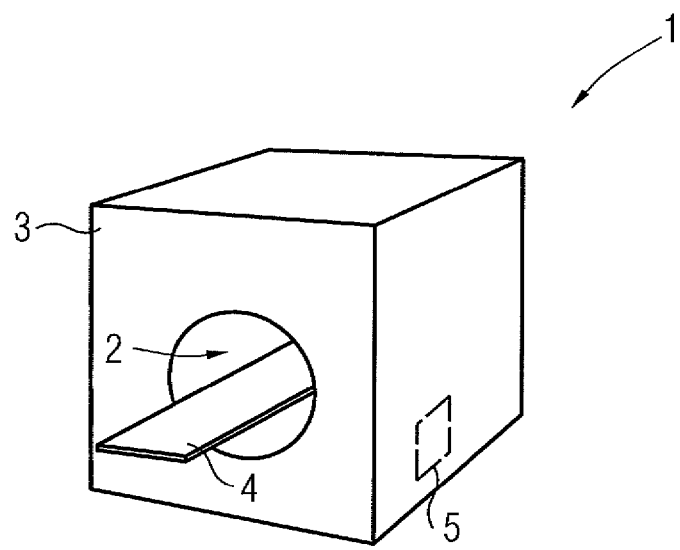
FIG. 1 shows one embodiment of a magnetic resonance apparatus.

FIG. 1 shows one embodiment of a magnetic resonance apparatus 1. The magnetic resonance apparatus 1 is able to read out, simultaneously, 128 of a possible 216 receive channels via corresponding inputs on receivers. The magnetic resonance apparatus 1 includes a patient chamber 2 in a magnet 3. A patient couch 4 may be introduced into the patient chamber 2. A receiving system 5 is provided to evaluate the signals.

Figure 2:
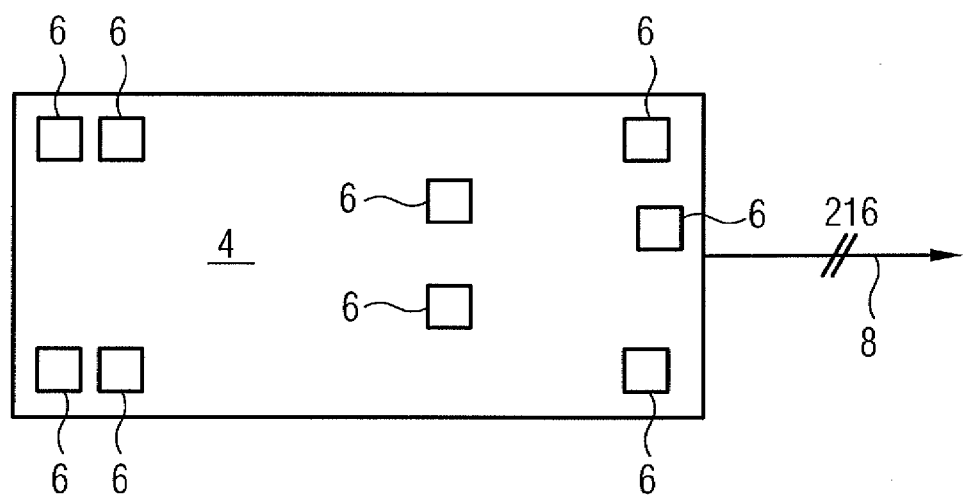
FIG. 2 shows a plan view of a patient couch of the magnetic resonance apparatus shown in FIG. 1.

FIG. 2 shows a plan view above the patient couch 4. As shown in FIG. 2, nine plug-in locations 6 for local coils are provided on the patient couch 4. Each of the plug-in locations 6 has pins (not shown in greater detail). Each receive channel includes twenty-four pins, such that coils having twenty-four receive channels (e.g., twenty-four coil elements or loops) may be connected to one plug-in location 6. Since local coils may have more than twenty-four receive channels or coil elements, the receive channels or coil elements for some local coils may, alternatively, be connected to a plurality of plug-in locations 6.

In one embodiment, the magnetic resonance apparatus has, at most, 216 (9×24) usable receive channels. However, not all of the usable receive channels have to be used simultaneously, since not all of the coil elements may be simultaneously located in a suitable position for receiving signals from the field of view or, alternatively, homogeneity volume. Even with 216 usable receive channels (216 connected coil elements), it is not necessary to read out all of the receive channels, with the result that the receiving system 7 may, as shown in more detail in FIG. 3, be configured to simultaneously receive a smaller number of receive channels. The 216 lines 8 shown in FIG. 2 connect to the patient couch 4 and, thus, the receive channels 216, to the receiving system 7.

Figure 3:
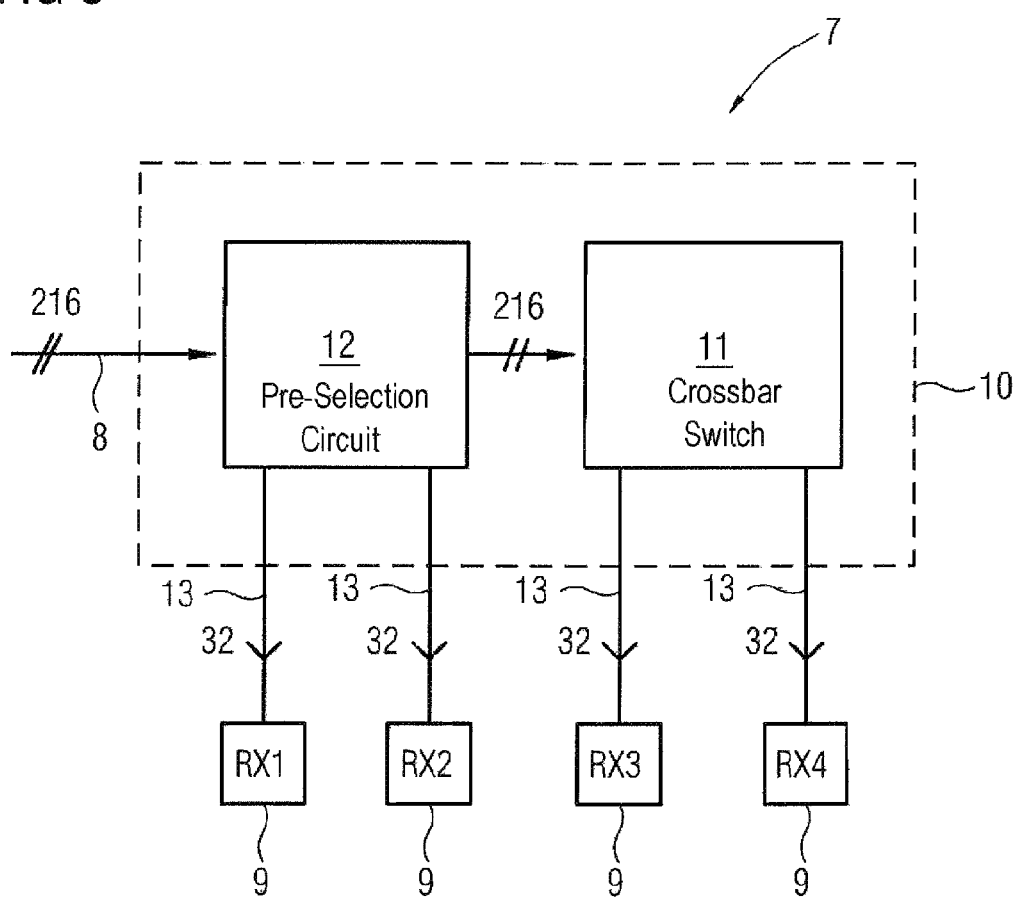
FIG. 3 is a block diagram of one embodiment of a receiving system.

As shown in FIG. 3, the receiving system 7 has four receivers 9. Each receiver 9 has thirty-two inputs. 128 total inputs are thus available in this embodiment.

In order to select the receive channels (out of the 216 possible) that are to be read out and to assign them to specific inputs of receivers 9, the receiving system 7 includes a switching device 10. The switching device 10 has a crossbar switch 11. Using the crossbar switch 11, the 216 receive channels, i.e. the 216 receive inputs, may be flexibly assigned to the sixty-four inputs of the two right-hand receivers 9.

The available inputs are thus divided into a first group of inputs and into a second group of inputs. In the embodiment illustrated by FIG. 3, each of the first and second groups of inputs has sixty-four inputs. The second group of inputs is flexibly assigned to receive channels by way of the crossbar switch 11.

When the switching device 10 is connected upstream of the crossbar switch 11, the apparatus 1 further includes a pre-selection circuit 12 (pre-selector). Using the pre-selection circuit 12, predetermined receive channels may be assigned either directly to an input of the first group of inputs or to the crossbar switch 11. Accordingly, the receive channels are also subdivided into a first group of receive channels and a second group of receive channels. The first group of receive channels may be directly assigned, via or using the connections 13, to a predetermined input of the first group of inputs, such that the first group of receive channels also has 64 members. The second group of receive channels, which in this embodiment equals 152 channels, is unconditionally assigned by or using the crossbar switch 11.

Figure 4:
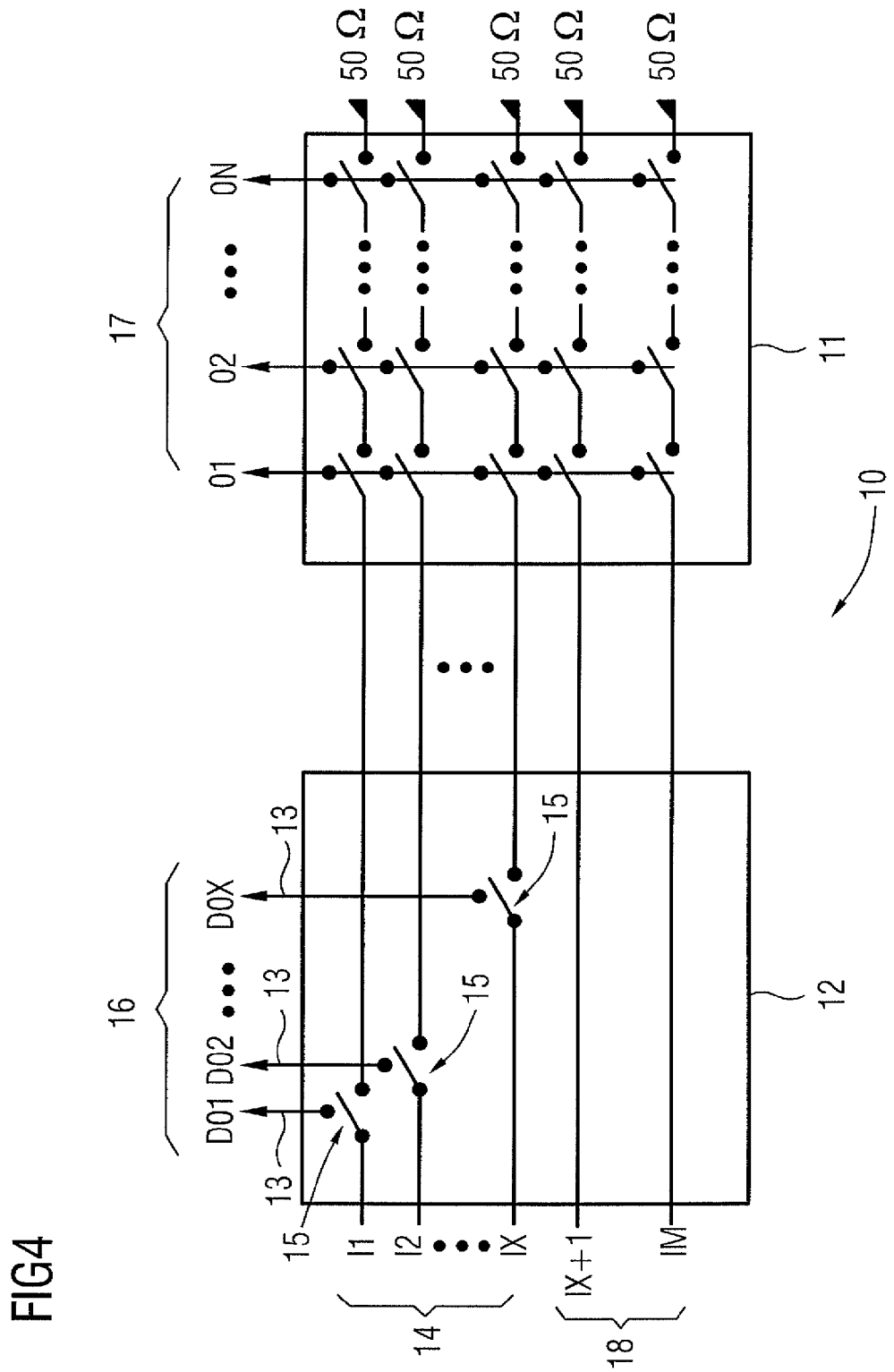
FIG. 4 shows one embodiment of a switching device of the receiving systems.

FIG. 4 shows the switching device 10 and, in particular, the pre-selection circuit 12 in greater detail. In the pre-selection circuit 12, X=64 receive channels. I1 . . . IX of the first group 14 of receive channels are each connected or coupled to a switch 15 that has a first and a second position. When the switch 15 is in the first position, I1 . . . IX of the first group 14 are directly connected, via a connection 13, to a predetermined input of the inputs DO1 . . . DOX of the first group 16 of inputs. When the switch 15 is in the second position, I1 . . . IX of the first group 14 are connected to the crossbar switch 11, which may, in turn, flexibly assign I1 . . . IX to one of the inputs O1 . . . ON of the second group 17 of inputs.

The second group 18 of receive channels, IX+1 . . . IM, where M in this embodiment equals 216, is connected directly to the crossbar switch 11.

Since the inputs and the members of the different groups are given purely by way of example, in other embodiments, other values for X, M and N may be used.

If only a relatively small or medium number of channels (e.g., sixty-four or less) is required, the selection capability, which is implemented by or using the switch 15, produces an apparatus 1 with total flexibility, as all of the required receive channels may be connected to the crossbar switch 11. If, however, a high or higher number of channels (e.g., more than sixty-four) is required, the apparatus 1 has less flexibility, because the switch 15 is controlled in such a way that a direct, fixed connection to an input DOn of the first group 16 of inputs exists.

The pre-selection circuit 12 is an autonomous, separate component, and thus may be easily retrofitted with the receivers 9 required for the first group 16 of inputs (e.g., the two left-hand receivers 9) when, for example, the capacities of the receiving system 7 are expanded.

In the present embodiment, the sixty-four receive channels of the first group 14 of receive channels are assigned to four specific plug-in locations 6 on the patient couch 4. This information is communicated to the user by or using, for example, a system specification. The user may, consequently, consider this knowledge when the planning of his/her image acquisition, such that in a planned, simultaneous use of more than sixty-four receive channels, he/she optimally assigns specific local coils to the plug-in locations 6.

Figure 5:
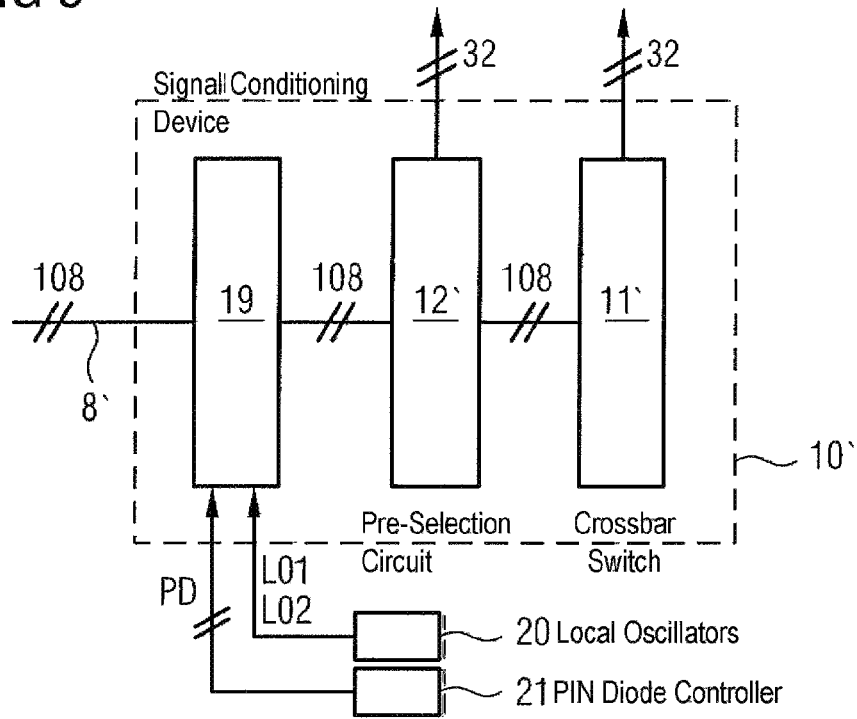
FIG. 5 shows another embodiment of switching device used with multiplexing.
Figure 6:
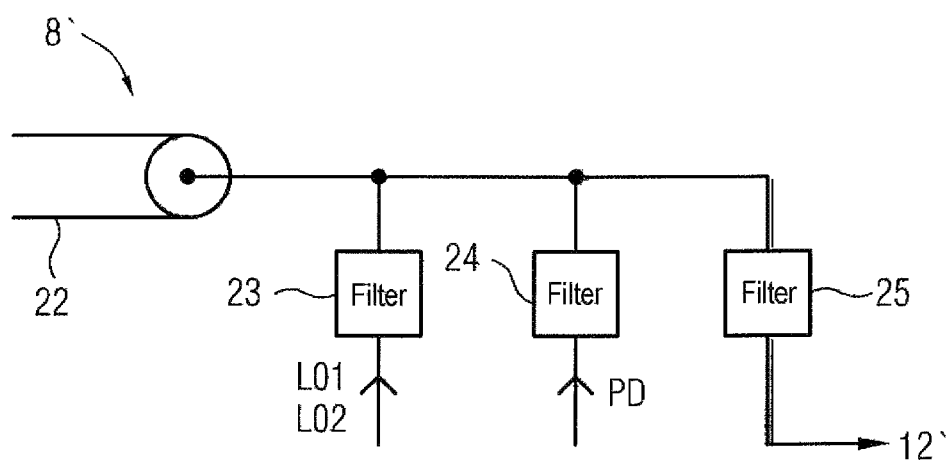
FIG. 6 shows filters used on incoming lines of the switching device shown in FIG. 5.

In other embodiments, as shown in FIGS. 5 and 6, a multiplexing method is used to transmit the receive signals of the individual receive channels. In these embodiments, the local coil includes two different types of mixers. The mixers are controlled by or using an auxiliary frequency (local oscillator frequency), such that the mixers transform two receive signals of different coil elements into two corresponding different intermediate frequencies. The two intermediate-frequency signals that correspond to each receive channel are then combined and may be transported over a single line. From the patient couch 4, only 108 lines 8' (see FIG. 5) reach the switch 10.' The switch 10' not only includes the already described crossbar switch 11' and pre-selection circuit 12', but also includes a signal conditioning device 19 that is connected upstream of the pre-selection circuit 12'. For each of the lines 8', the signal conditioning device separates the auxiliary-frequency signals, the PIN diode signals and the receive signals by or using a multiplexing filter bank, as shown in greater detail in FIG. 6. In this embodiment, the auxiliary-frequency signals LO1 and LO2 are generated by corresponding local oscillators 20, while the PIN diode signals PD are transmitted by the PIN diode controller 21 and are low-frequency signals.

As shown in FIG. 6, three filters 23, 24 and 25 are used on each of the incoming lines 8', which are, in this embodiment, coaxial cables 22. The incoming auxiliary-frequency signals LO1, LO2 pass through a high-pass filter 23 on their way to the aforementioned mixers in the local coil. The low-frequency PIN diode signal PD passes through a low-pass filter 24 on its way to the PIN diodes in the local coil. Finally, the receive signals pass through a suitable band-pass filter 25 on their way to the pre-selection circuit 12'.

In other embodiments, such as the ones depicted by FIGS. 3 and 4, a signal conditioning device 19 may also be coupled or connected to the PIN diode signals to detune the coil elements.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance apparatus comprising:
a receiving system having at least one receiver configured to process at least one receive signal of a receive channel; and
at least one switching device configured to variably assign a first number of receive channels to a first number of inputs of the at least one receiver, the at least one switching device having a crossbar switch and a pre-selection circuit connected upstream of the crossbar switch,
wherein each receive channel of a first group of receive channels is directly connected to an input of a first group of inputs that is permanently assigned to the respective receive channel.

2. The magnetic resonance apparatus as claimed in claim 1, further comprising a patient couch having plug-in locations for a local coil and predetermined pins for at least one plug-in location, wherein the predetermined pins for the at least one plug-in location are configured to be assigned to receive channels of the first group of receive channels.

3. The magnetic resonance apparatus as claimed in claim 1, further comprising a patient couch having plug-in locations for a local coil and predetermined pins for all of the plug-in locations, wherein the predetermined pins for all of the plug-in locations are configured to be assigned to receive channels of the first group of receive channels.

4. The magnetic resonance apparatus as claimed in claim 1, further comprising an at least partially wireless connection configured to transmit the receive signals from a local coil to the at least one switching device.

5. The magnetic resonance apparatus as claimed in claim 4, wherein the crossbar switch is configured to distribute receive channels that form a second group of receive channels and are not assigned to any direct connection to an input to a second group of inputs.

6. The magnetic resonance apparatus as claimed in claim 1, wherein the crossbar switch is configured to distribute receive channels that form a second group of receive channels and are not assigned to any direct connection to an input to a second group of inputs.

7. The magnetic resonance apparatus as claimed in claim 2, wherein the crossbar switch is configured to distribute receive channels that form a second group of receive channels and are not assigned to any direct connection to an input to a second group of inputs.

8. The magnetic resonance apparatus as claimed in claim 3, wherein the crossbar switch is configured to distribute receive channels that form a second group of receive channels and are not assigned to any direct connection to an input to a second group of inputs.

9. The magnetic resonance apparatus as claimed claim 1, wherein the pre-selection circuit includes at least one switch, and, using the at least one switch, at least one receive channel of the first group of receive channels is connected either to the crossbar switch or to the direct connection to the input of the first group of inputs.

10. The magnetic resonance apparatus as claimed claim 4, wherein the pre-selection circuit includes at least one switch, and, using the at least one switch, at least one receive channel of the first group of receive channels is connected either to the crossbar switch or to the direct connection to the input of the first group of inputs.

11. The magnetic resonance apparatus as claimed claim 5, wherein the pre-selection circuit includes at least one switch, and wherein, at least one receive channel of the first group of receive channels is connected, via the at least one switch, either to the crossbar switch or to the direct connection to the input of the first group of inputs.

12. The magnetic resonance apparatus as claimed in claim 9, wherein each receive channel of the first group of receive channels is configured to be assigned a switch, and wherein, each receive channel is connected, via the switch, either to a corresponding input of the first group of inputs or to the crossbar switch.

13. The magnetic resonance apparatus as claimed in claim 10, wherein each receive channel of the first group of receive channels is configured to be assigned a switch, and wherein, each receive channel is connected, via the switch, either to a corresponding input of the first group of inputs or to the crossbar switch.

14. The magnetic resonance apparatus as claimed in claim 11, wherein each receive channel of the first group of receive channels is configured to be assigned a switch, and wherein, each receive channel is connected, via the switch, either to a corresponding input of the first group of inputs or to the crossbar switch.

15. The magnetic resonance apparatus as claimed in claim 1, wherein each receive channel of the first group of receive channels is configured to be assigned a switch, and wherein, each receive channel is connected, via the switch, either to a corresponding input of the first group of inputs or to the crossbar switch.

16. The magnetic resonance apparatus as claimed in claim 1, wherein the pre-selection circuit is a separate and retrofittable component.

17. The magnetic resonance apparatus as claimed in claim 1, further comprising a multiplexer configured to generate one line for at least two receive channels at different intermediate frequencies.

18. The magnetic resonance apparatus as claimed in claim 14, wherein the switching device further comprises a signal conditioning device for each incoming line, and wherein each signal conditioning device has:
a band-pass filter connected upstream of the corresponding input of the pre-selection circuit and configured to allow the intermediate frequencies to pass through;

a high-pass filter connected upstream of a coupling-in point for the auxiliary-frequency signals and configured to convert intermediate-frequencies; and a low-pass filter connected upstream of a coupling-in point for control signals for the PIN diodes.

19. A pre-selection circuit for use in a magnetic resonance apparatus, the pre-selection circuit comprising:

a group of receive channels; and a switch connected to each receive channel of the group of receive channels and movable between a first position and a second position, wherein, when the switch is in the first position, the receive channels of the group of receive channels are directly connected to a corresponding input of a first group of inputs, and when the switch is in the second position, the receive channels of the group of receive channels are configured to connect with a crossbar switch.

20. The pre-selected circuit as claimed in claim 16, wherein the crossbar switch is configured to flexibly assign each receive channel of the group of receive channels to a corresponding input of a second group of inputs.

* * * * *